(12) United States Patent
Forrest et al.

(10) Patent No.: US 9,700,901 B2
(45) Date of Patent: Jul. 11, 2017

(54) ORGANIC VAPOR JET PRINT HEAD WITH SOLDER JOINT

(71) Applicant: The Regents of the University of Michigan, Ann Arbor, MI (US)

(72) Inventors: Stephen R. Forrest, Ann Arbor, MI (US); Gregory McGraw, Yardley, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/563,803

(22) Filed: Dec. 8, 2014

(65) Prior Publication Data

US 2015/0090775 A1  Apr. 2, 2015

Related U.S. Application Data

(62) Division of application No. 13/774,117, filed on Feb. 22, 2013, now Pat. No. 8,944,309.

(Continued)

(51) Int. Cl.
*B23K 1/19* (2006.01)
*B05B 1/00* (2006.01)
(Continued)

(52) U.S. Cl.
CPC ............... *B05B 1/00* (2013.01); *B05C 11/00* (2013.01); *B23K 1/0008* (2013.01);
(Continued)

(58) Field of Classification Search
CPC ............ B41J 2/1623; B41J 2002/14362; B41J 2/14024; B41J 2/1433; B41J 2/16;
(Continued)

(56) References Cited

U.S. PATENT DOCUMENTS 2,882,587 A    4/1959  Unger et al.
3,907,620 A *  9/1975  Abraham ................ H01L 21/00
                                                            204/192.25
(Continued)

FOREIGN PATENT DOCUMENTS

JP    2001001133 A  *  1/2001

OTHER PUBLICATIONS

NN81091808 IBM Technical Disclosure Bulletin Sep. 1, 1981; Ink Jet Nozzle Structure.*
(Continued)

*Primary Examiner* — Erin Saad
(74) *Attorney, Agent, or Firm* — Reising Ethington P.C.

(57) ABSTRACT

A solder joint may be used to attach components of an organic vapor jet printing device together with a fluid-tight seal that is capable of performance at high temperatures. The solder joint includes one or more metals that are deposited over opposing component surfaces, such as an inlet side of a nozzle plate and/or an outlet side of a mounting plate. The components are pressed together to form the solder joint. Two or more of the deposited metals may be capable of together forming a eutectic alloy, and the solder joint may be formed by heating the deposited metals to a temperature above the melting point of the eutectic alloy. A diffusion barrier layer and an adhesion layer may be included between the solder joint and each of the components.

8 Claims, 2 Drawing Sheets

Related U.S. Application Data

(60) Provisional application No. 61/718,399, filed on Oct. 25, 2012.

(51) Int. Cl.
    *C23C 14/12*     (2006.01)
    *C23C 14/04*     (2006.01)
    *C23C 14/22*     (2006.01)
    *B05C 11/00*     (2006.01)
    *B23K 1/00*     (2006.01)
    *B32B 37/12*     (2006.01)
    *B32B 37/18*     (2006.01)
    *H01L 51/00*     (2006.01)
    *B23K 101/00*     (2006.01)

(52) U.S. Cl.
CPC .......... *B32B 37/1284* (2013.01); *B32B 37/18* (2013.01); *C23C 14/04* (2013.01); *C23C 14/12* (2013.01); *C23C 14/228* (2013.01); *B23K 2201/00* (2013.01); *H01L 51/0005* (2013.01)

(58) Field of Classification Search
CPC .......... B41J 2002/14387; B41J 2202/19; B41J 2/01; B23K 26/388; B23K 3/0607; B23K 1/012
USPC .............................. 228/262.1, 262.6, 262.61
See application file for complete search history.

(56) References Cited

U.S. PATENT DOCUMENTS

| | | | | |
|---|---|---|---|---|
| 5,336,929 A | * | 8/1994 | Hayashi | H01L 24/80 257/643 |
| 5,508,561 A | * | 4/1996 | Tago | H01L 24/11 257/737 |
| 5,781,212 A | * | 7/1998 | Burr et al. | 347/84 |
| 6,746,782 B2 | * | 6/2004 | Zhao | C22C 27/00 204/192.15 |
| 2004/0060962 A1 | * | 4/2004 | Jacobson | 228/56.3 |
| 2006/0079019 A1 | * | 4/2006 | Kim | 438/106 |

OTHER PUBLICATIONS

IBM Technical Disclosure Bulletin, Jan. 1987 NN87013710 "Method for Fabricating Thin Braze Joint".*
JP 2001001133 A computer english translation Mar. 10, 2016.*

* cited by examiner

# ORGANIC VAPOR JET PRINT HEAD WITH SOLDER JOINT

CROSS-REFERENCE TO RELATED APPLICATION

This application is a divisional of U.S. patent application Ser. No. 13/774,117, filed Feb. 22, 2013, which claims the benefit of U.S. Provisional Patent Application No. 61/718,399, filed Oct. 25, 2012. The complete disclosures of these applications are hereby incorporated by reference.

JOINT RESEARCH AGREEMENT

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

TECHNICAL FIELD

This disclosure relates to structures and methods of making microfluidic devices such as those used in organic vapor jet printing systems.

BACKGROUND OF THE INVENTION

Various techniques have been developed for depositing and/or patterning organic materials on a substrate for use in constructing organic opto-electronic devices such as organic light emitting diodes (OLEDs), organic phototransistors, organic photovoltaic (PV) cells, or organic photodetectors. These techniques include vacuum thermal evaporation, solution processing, and organic vapor phase deposition, along with printing techniques such as inkjet printing, nozzle printing, thermal vapor jet printing, and organic vapor jet printing (OVJP). Some of these techniques include flowing high temperature fluids and/or high pressure fluids through various components and interfaces between components that may range in size from a macroscopic level, at which bulk materials are typically provided and stored, to a microscopic level, at which the materials may be effectively utilized. One or more seals may be provided at these interfaces to prevent fluid leakage.

An organic vapor jet printer can include multiple components or subcomponents assembled together. In some cases, adjacent components are bonded to each other with polymer-based adhesives or with metal fasteners such as bolts. Due to the elevated temperatures at which some OVJP components must operate, there are some limitations on the types of adhesives than can be used, as polymer-based materials can soften, melt, or suffer from gradual degradation at such temperatures. Where metal fasteners are employed, additional provisions such as gaskets or seals may be necessary to form a fluid-tight connection between the components so that the fluid passing from one component to the other does not leak from the joint. Such gaskets or seals are often also formed from high-temperature polymer-based materials for similar reasons as an adhesive joint.

SUMMARY

In accordance with one embodiment, an organic vapor jet printing (OVJP) device includes a first plate having a first surface and one or more fluid flow ports located at said first surface and a second plate having a second surface and one or more fluid flow ports located at said second surface. The first and second surfaces oppose each other, and the device further includes a solder joint located between the first and second surfaces. The solder joint circumscribes the fluid flow ports to form a fluid-tight seal between the plates.

In accordance with another embodiment, a method of making an OVJP device includes the steps of: (a) providing first and second plates, each plate having one or more fluid passages formed therethrough; (b) depositing a metal layer over a surface of at least one of the plates; and (c) pressing the plates together with the metal layer(s) arranged between the plates to form a solder joint that forms a fluid-tight seal between the fluid passage(s) of the first plate and the fluid passage(s) of the second plate.

In accordance with another embodiment, a method of making an OVJP device includes the steps of: (a) providing a nozzle plate having a fluid inlet side and a mounting plate having a fluid outlet side; (b) depositing an adhesion layer over at least one of said inlet or outlet sides; (c) depositing a diffusion barrier layer over at least one of said inlet or outlet sides; (d) depositing a layer of noble metal over at least one of said inlet or outlet sides; (e) depositing a layer of metal capable of forming a eutectic alloy with the noble metal over at least one of said inlet or outlet sides; and (f) forming said eutectic alloy between said inlet and outlet sides with said inlet and outlet sides facing each other.

BRIEF DESCRIPTION OF THE DRAWINGS

Illustrative embodiments will hereinafter be described in conjunction with the appended drawings, wherein like designations denote like elements, and wherein.

DETAILED DESCRIPTION OF THE ILLUSTRATED EMBODIMENT(S)

A solder joint may be used to attach components of an organic vapor jet printing device together with a fluid-tight seal that is capable of long-term performance at the elevated temperatures at which certain OVJP components operate. The solder joint may include one or more metals that are deposited over opposing component surfaces, such as a nozzle plate surface and/or a mounting plate surface. The solder joint may be formed from two or more metals that can be individually deposited and then combined to form an alloy. While presented here in the context of print head components for an OVJP device, various aspects of the solder joint described below may be used to join other OVJP components or other microfluidic delivery system components.

Figure 1:
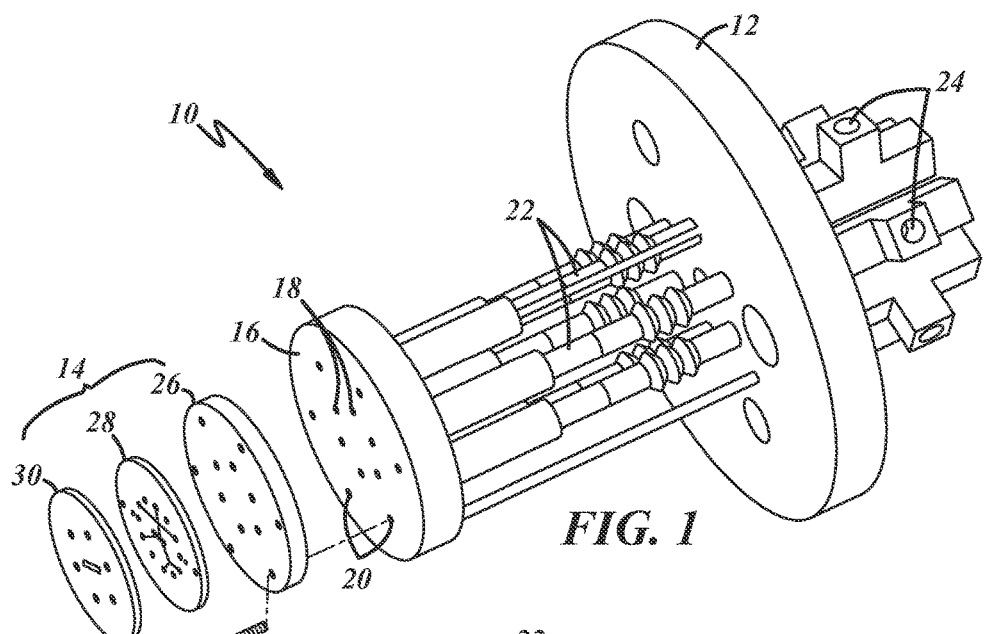
FIG. 1 is a partially exploded view of portions of an illustrative organic vapor jet printing (OVJP) device, showing print head components separated from a fixture that can supply high temperature gases to the print head.

Referring to FIG. 1, a microfluidic delivery system is shown in the form of an OVJP printing device 10. The illustrated device 10 includes a fixture 12 and a microfluidic device 14 (shown in exploded view) adapted for attachment to the fixture. The microfluidic device 14 is a microfluidic print head in the illustrated embodiment. The fixture 12 may be provided in any number of forms or configurations and may generally be described as any component that provides one or more fluids to the microfluidic device 14 when it is attached to the fixture. In the illustrated embodiment, the fixture 12 includes a mounting surface 16, having fluid outlet ports 18 and attachment features 20 formed therein, along with various conduits 22 and ports 24 for transporting and delivering high temperature and/or high pressure gases or other fluids to the attached microfluidic device 14. For example, organic materials supplied to the conduits 22 may be heated to vaporize the organic materials. The same or different organic materials can be disposed in each individual conduit 22. The ports 24 may be used to introduce a carrier gas, such as nitrogen or some other gas that does not react with the organic materials, to the printing device 10. The carrier gas flows through the conduits 22 to mix with the vapor produced therein and to deliver the organic vapor to the print head 14. In the illustrated embodiment, the fixture 12 delivers high temperature gases to the print head 14 through the outlet ports 18. The fixture 12 may of course include any number of other components not shown or described here.

The print head 14 is adapted for attachment to the OVJP device 10 and is configured to receive one or more fluids from the outlet ports 18 of the fixture 12 at one end, and to deliver the fluid(s) at an opposite end through openings or channels that are generally on a micron dimensional scale (e.g., from about 1-500 µm). The print head 14 may distribute and/or accommodate mixing of the various vapors introduced thereto. In the illustrated embodiment, threaded fasteners 25 (only one is shown in FIG. 1) are included to removably fasten the print head 14 to the fixture 12, but any suitable attachment, whether temporary or permanent, may be employed. As shown in FIG. 1, the print head 14 may include a fixture plate 26, a circuit plate 28, and a microfabricated die or nozzle plate 30. Each of these plates 26-30 includes fluid inlet and outlet sides and one or more fluid passages that interconnect the inlet and outlet sides of the plates in which they are formed. Each fluid passage is in fluid communication with one or more ports, and each of the components are in fluid communication with each other via one or more ports.

The fixture plate 26 generally acts as a structural member that supports the other potentially more intricate or fragile components of the print head 14. For example, in the embodiment of FIG. 1, the fixture plate 26 accommodates the load of the fasteners 25 when assembled to the fixture 12. In the removable configuration shown, the fixture plate 26 also accommodates easy removal of the print head 14 from the fixture 12 without the necessity of breaking an adhesive bond, for example, between the print head and the fixture. The circuit plate 28 is an optional layer interposed between the fixture plate 26 and the nozzle plate 30 that may be configured to receive fluid, to mix and/or distribute fluid as it passes therethrough, and to provide the fluid to the nozzle plate. The nozzle plate or die 30 receives fluid at one side and expels the fluid at another side, directed at a print surface or other substrate, for example. Some examples of print head components 26-30 are described in further detail in U.S. patent application Ser. No. 13/235,981, which is hereby incorporated by reference in its entirety.

Figure 2:
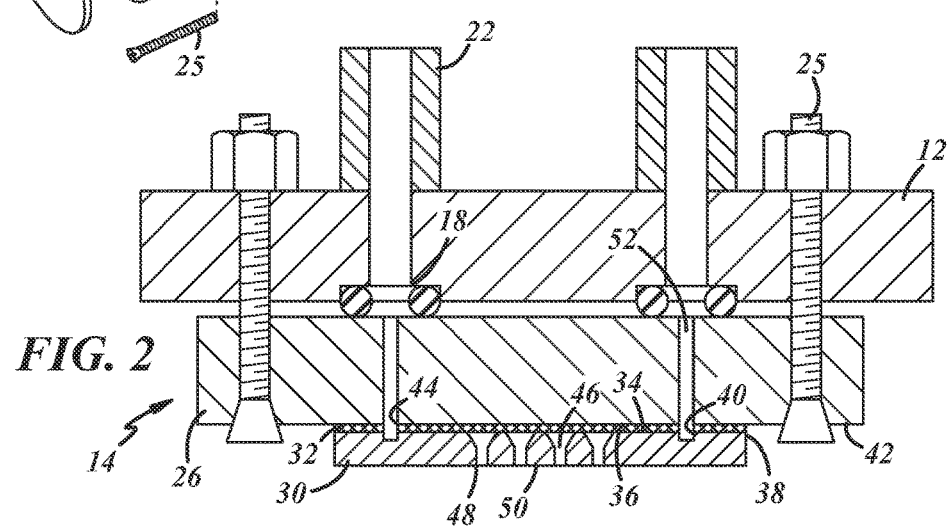
FIG. 2 is a cross-sectional view of a portion of another example of a print head attached to a fixture, where the print head includes a solder joint.

FIG. 2 is a partial cross-sectional view of an embodiment of an OVJP device similar to that of FIG. 1, showing an example of the print head 14 without a circuit plate. The example shown in FIG. 2 includes a solder joint 32 located between the fixture plate 26 and the nozzle plate 30. The solder joint 32 is metallic and bonds the plates 26, 30 together. The solder joint 32 may also act as a fluid-tight seal that prevents fluid leakage from between the plates 26, 30. Thus, the solder joint 32 may eliminate the need for high-temperature polymer-based adhesives, gaskets, and/or seals. Though shown here as a sealing attachment between the fixture plate 26 and the nozzle plate 30, the solder joint 32 may be used to join other print head 14 components and/or other OVJP device 10 components. For example, the solder joint 32 could be employed to join the nozzle plate 30 to a circuit plate such as that shown in FIG. 1, to join a circuit plate to the fixture plate and/or the nozzle plate, to join the nozzle plate directly to the fixture 12, or to join any other plates or layers that may be part of the device 10 (e.g., insulating layers, adapter layers, etc.).

The illustrated solder joint 32 is located between a first surface 34 and an opposing second surface 36. The first surface 34 in this example is located at an inlet side 38 of the nozzle plate 30, which also includes fluid flow ports or inlet ports 40. The second surface 36 in this example is located at an outlet side 42 of the fixture plate 26, which also includes fluid flow ports or outlet ports 44. The solder joint 32 circumscribes the fluid flow ports to form a fluid-tight seal and bond between the plates 26, 30. Certain fluid flow ports may be circumscribed individually (e.g., to prevent unwanted mixing), and certain fluid flow ports may be circumscribed together (e.g., where the fluid composition at different ports is the same). The solder joint 32 in this example is a layer of metal that extends across the entire surface 34 of the nozzle plate 30, with openings formed therethrough to allow fluid to pass through the layer from the fixture plate 26 to the nozzle plate 30. The solder joint 32 need not fill the entire space between the plates 26, 30, however.

The nozzle plate 30 includes one or more fluid flow passages 46. In this example, the nozzle plate 30 includes a plurality of micronozzles 46 that extend through the plate and fluidly connect the inlet ports 40 located at the first surface 34 with a plurality of fluid outlet ports 48 located at an opposite surface 50. The nozzles may be shaped with cross-sections that are reduced in size as they extend through the plate 30 in the fluid flow direction. The nozzle plate 30 may include other fluid flow passages not shown in this particular cross-section, such as distribution or mixing channels like those found in the circuit plate of FIG. 1 that fluidly connect the inlet ports 40 with the nozzles 46. Organic vapor-containing fluid may exit or be expelled from the device 10 at the nozzle plate outlet ports 48 and directed at a substrate. For example, the nozzle plate 30 may include an array of micronozzles 46 configured to receive organic vapor-containing fluid via the fluid flow ports 40 and to expel the fluid from the device toward a print surface for controlled deposition of the organic material(s). Each individual nozzle 46 of the array may deliver a fluid with the same or different composition as other individual nozzles. For example, different colors of fluids (e.g., red, blue and green) may each be expelled from one or more nozzles of the array.

In one embodiment, the nozzle plate 30 is microfabricated using known patterning techniques. It may be formed from silicon (Si), an Si-based material, or any other suitable material. Micromachining, mask-and-etch or other methods may also be used to form the nozzle plate 30. The fixture plate 26 may be formed from a variety of materials, including metallic or non-metallic materials. In one embodiment, the fixture plate 26 is formed from a Fe—Ni—Co alloy such as Kovar®. As shown in FIG. 2, the fixture plate 26 also includes one or more fluid passages 52 that fluidly connect opposite sides of the fixture plate and accommodate fluid flow from the fixture 12 to the nozzle plate 30. As noted above, other plates or layers may also be included as part of the print head 14, such as a glass circuit plate, or one or more additional microfabricated layers. Additional plates may be bonded with adjacent plates using another solder joint as taught herein, or by other means.

Figure 3:
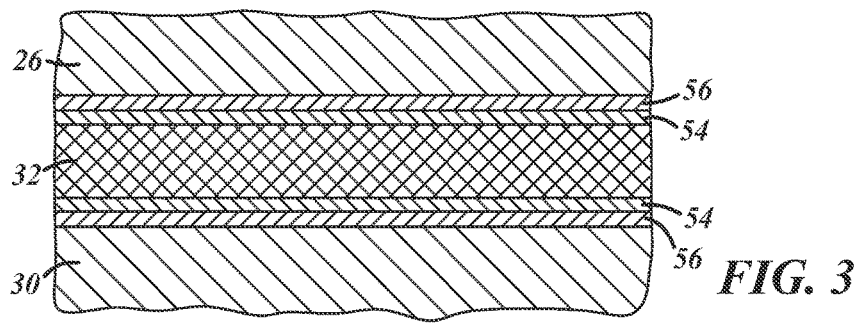
FIG. 3 is an enlarged view of the solder joint of FIG. 2.

FIG. 3 is an enlarged view of the solder joint 32 of FIG. 2, showing additional layers of material between the solder joint 32 and each of the plates 26, 30. A diffusion barrier layer 54 may be located between the solder joint 32 and each of the plates 26, 30 as shown. The diffusion barrier layer 54 is a layer intended to limit, slow or prevent interdiffusion of material between the solder joint 32 and one or both of the plates 26, 30. For example, when the material or materials used to form the solder joint 32 have a relatively high diffusion rate with one or both of the plate materials, the diffusion barrier layer 54 may be provided, with the material of the barrier layer selected so that the solder joint material(s) have a lower diffusion rate therethrough. The barrier layer 54 may be useful during solder joint formation, examples of which are described below, particularly where diffusion during solder joint formation could affect the composition of the solder joint material. Thus the composition of the diffusion barrier layer 54 may depend at least partly on the composition of the solder joint 32 and/or the materials from which the solder joint is formed. Where the solder joint includes gold (Au), certain other noble metals such as platinum (Pt), iridium (Ir), palladium (Pd) or alloys thereof may serve as suitable barrier layers.

An adhesion layer 56 may also be located between the solder joint 32 and each of the plates 26, 30. In this example, an adhesion layer 56 is located between each of the diffusion layers 54 and each of the plates 26, 30—i.e., the adhesion layer is adjacent one or both of the plates. The adhesion layer 56 is a layer of material intended to promote adhesion of overlying and underlying materials and may function by providing a higher surface energy than the underlying material, by leveling the underlying surface and/or by other means. One example of a suitable adhesion layer material is a metallic material that quickly forms a surface oxide, such as chromium or titanium.

In one embodiment, the diffusion barrier layer 54 is included between the solder joint 32 and only one of the plates 26, 30, preferably the nozzle plate. In another embodiment, the adhesion layer 56 is included between the solder joint 32 and only one of the plates 26, 30. In some cases, neither of the layers 54, 56 is included. In yet another embodiment, the diffusion barrier layer 54 and the adhesion layer 56 are combined as a single layer having a single composition that acts as a diffusion barrier and an adhesion promoter. This could include an alloy or mixture of different materials or co-deposited materials, for example, or a single elemental material may sufficiently perform both functions.

The barrier layer 54 and the adhesion layer 56 may be relatively thin layers compared to the solder joint 32 or may have thicknesses in a lower range than the solder joint. For example, the combined thickness of the barrier and adhesion layers (between the solder joint 32 and one of the plates 26, 30) may range from 10 nm to 500 nm. In another embodiment, the combined thickness of layers 54 and 56 is in a range between 20 nm to 200 nm. In another embodiment, the combined thickness is in a range from 40 nm to 100 nm. For example, each of the layers 54, 56 may individually range from 5 nm to 250 nm, 10 nm to 100 nm, or 20 nm to 50 nm. In one particular embodiment, the adhesion layer 56 is about 20 nm thick and the diffusion barrier layer is about 30 nm thick. In another embodiment, the combined thickness of layers 54, 56 is greater than or equal to the surface roughness of one or both of the opposing surfaces 34, 36. In yet another embodiment, the combined thickness of layers 54, 56 is sufficient to fully wet the component surface over which they are deposited.

The solder joint 32 may range in thickness from about 0.1 µm to about 2.0 µm, from about 0.5 µm to about 1.5 µm, or from about 0.5 to about 1.0 µm. In some implementations, the presence of the diffusion barrier layer 54 can facilitate a thinner solder joint 32. Thinner layers and joints within a multi-layer structure such at that in FIG. 3 may help reduce stresses within the structure, particularly in applications where thermal cycling is present. In another embodiment, the solder joint 32 is thinner than the nozzle plate 30. For example, the nozzle plate may range in thickness from about 50 µm to about 100 µm. The solder joint 32 is formed from a metallic material, thus avoiding any potential high temperature degradation that can occur with polymer-based adhesives or other organic materials. In one embodiment, the solder joint 32 comprises a noble metal—i.e., ruthenium, rhodium, palladium, silver, osmium, iridium, platinum, gold, or any combination thereof. The solder joint metal may be elemental or a metal alloy.

In one embodiment, the solder joint 32 is formed as a eutectic alloy. The eutectic alloy includes two or more metals and is characterized by a eutectic temperature and a eutectic composition. The eutectic temperature is the melting point of the eutectic alloy at the eutectic composition, and the eutectic composition is the composition that results in a single melting point for the particular mixture of metals—as opposed to non-eutectic compositions where solid/liquid multi-phase mixtures result as the material is melted. Examples of suitable eutectic alloys include a gold-germanium (Au—Ge) alloy, a lead-tin (Pb—Sn) alloy or a gold-tin (Au—Sn) alloy, but there are others, and not all are binary systems. The solder joint 32 may include a mixture of metals, any two or more of which are capable of forming a eutectic alloy. For example, the solder joint 32 may include a noble metal and a second metal capable of forming a eutectic alloy with the noble metal.

Figure 4:
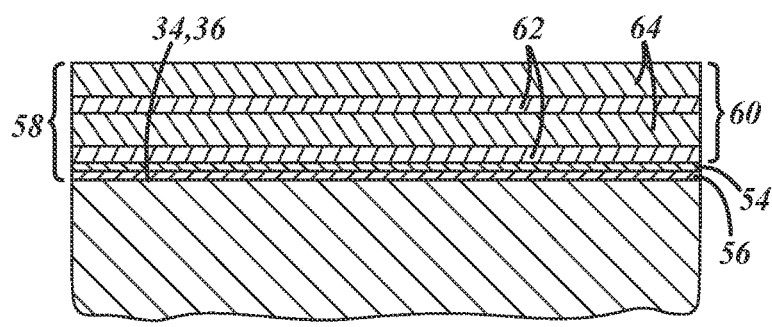
FIG. 4 is a schematic side view of multiple layers of material deposited over a component surface in preparation for forming a solder joint.

FIG. 4 is a schematic side view of multiple layers of material deposited over a first component surface. This layered structure can be used to form the solder joint described above. The component surface can be either of the opposing surfaces 34, 36 described above, and the multiply layers of material may together be referred to as a multi-layer coating 58. Where the diffusion barrier layer 54 and/or the adhesion layer 56 are present, the overlying materials may together be referred to as a solder pre-cursor layer 60. The illustrated solder pre-cursor layer 60 includes alternating layers of first and second metals 62, 64. In embodiments where it is desired to form the solder joint as a eutectic alloy, the thickness of the individual layers may be selected so that the overall composition of layer 60 is the eutectic composition. For example, where the desired solder joint is a Au—Ge eutectic alloy, alternating layers of 266 nm of gold and 160 nm of geranium may be suitable to achieve the eutectic composition. This is only one non-limiting example, and the relative layer thicknesses can vary depending on several factors, including the method used to deposit each layer, which may affect the density of the layers. Any metal deposition technique may be used to deposit each layer of material over the component surface 34, 36, such as known vapor deposition techniques, sputtering, electroplating, etc. It may be desirable that the outermost layer, layer 64 in the illustrated example, is a noble metal or some other non-reactive or low-reactivity metal to protect the underlying layers prior to solder joint formation. For example, where the desired solder joint is a Au—Ge alloy. the outermost layer 64 may be gold. Additionally, where a eutectic alloy is desired in the solder joint, the weight ratio and/or thicknesses of the metals deposited over the other opposing surface 34 or 36—intended to be on the other side of the formed solder joint—should be accounted for when selecting layer thicknesses.

Figure 5:
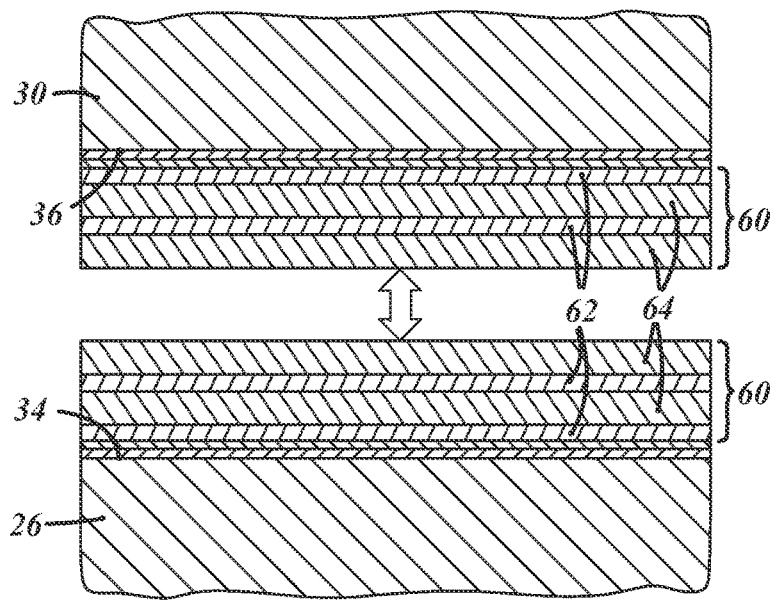
FIG. 5 is a schematic side view of two plates prepared as in FIG. 4, where the deposited material layers on each component are facing each other in preparation for solder joint formation.
Figure 6:
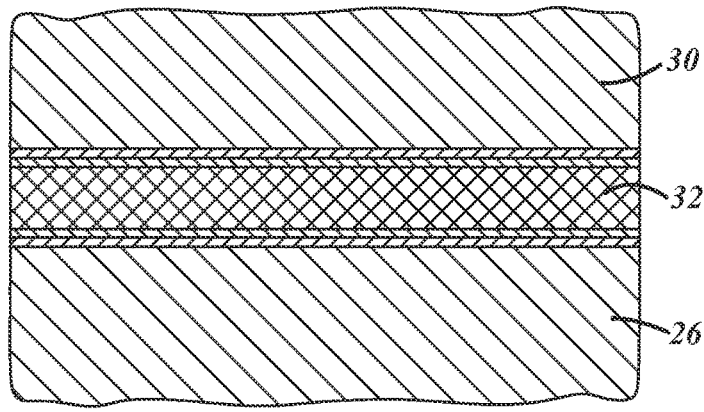
FIG. 6 is a schematic side view of the two components of FIG. 5 with the solder joint formed therebetween.

FIG. 5 shows first and second plates 26, 30 prepared like that of FIG. 4 with opposing surfaces 34, 36 facing each other in preparation for solder joint formation. While each plate in the above-described print head may include one or more fluid passages formed therethrough, the fluid passages are omitted in FIGS. 4-6 for simplicity. The opposing solder joint pre-cursor layers 60 may be brought into contact and pressed together and/or heated to form the solder joint 32 shown in FIG. 6. Accordingly, one embodiment of a method of making an OVJP device includes the steps of: (a) providing first and second plates 26, 30, each plate having one or more fluid passages formed therethrough; (b) depositing a metal layer over a surface of at least one of the plates; and (c) pressing the plates together with the metal layer(s) arranged between the plates to form the solder joint 32. The solder joint 32 forms a fluid-tight seal between the fluid passage(s) of the first plate 26 and the fluid passage(s) of the second plate 30.

The method may include depositing two or more different metals so that the solder joint 32 comprises an alloy of the two or more metals, such as the eutectic alloy described above or some other alloy. Where two or more metals are deposited, they may be deposited in layers as shown in the figures, or they may be co-deposited by techniques such as sputtering or plating from multiple sources simultaneously. Any of the layers may itself be a co-deposited layer. Thus, the method may include depositing a layer of a first metal over a layer of a different second metal and/or co-depositing two or more different metals over one or both surfaces 34, 36. The different metals may also be patterned over the component surfaces. Where a layer of metal comprises a non-noble metal, it may be desirable that the outermost or capping layer be a noble metal. For example, where a noble metal such as gold and a non-noble metal such as germanium are co-deposited, an outermost layer of gold may be deposited over the mixed layer to prevent oxidation or other contamination of the deposited materials. Where it is desired to control the ratio of the different metals, such a neat capping layer should be accounted for. At least two of the different metals may be selected to be capable of together forming a eutectic alloy. In this case, the metals may be deposited in respective amounts corresponding to the eutectic composition of the eutectic alloy.

The metal layer or layers may also be heated to form the solder joint 32. Where it is intended to form the solder joint 32 as a eutectic alloy, the step of heating may be performed so that the metal layers are heated to a temperature above the eutectic temperature of the alloy during solder joint formation. A temperature that is at least about 20° C. greater than the eutectic temperature is one suitable temperature. A wafer bonder may be used to press the plates together and/or to heat the metal layer(s). In one particular example, the wafer bonder is evacuated, heated to at least 20° C. higher than the eutectic temperature, and a pressure in a range from about 1-5 MPa is applied to the stacked plates by the wafer bonder. The temperature and pressure is held for approximately 60 minutes, and the assembly is air-cooled to form the solder joint. The relatively low formation pressure has been found to be advantageous with microfluidic devices such as the above-described print head, such devices having a limited ability to withstand high mechanical loads due in part to the microfabricated features formed therein.

The method may include additional steps or certain steps may be omitted. For example, the surfaces to be bonded by the solder joint may be processed or prepared for bonding. This may include polishing the surface(s) to achieve a smooth or mirror-like finish (e.g., <20 nm RMS surface roughness) and/or a high degree of flatness (e.g., ±3 μm). Other methods of heating the deposited metals may be employed, and the metals may be heated before or after the opposing solder pre-cursor layers are brought into contact with each other. The deposited metal layer(s) may be eutectic compositions as deposited and/or more traditional soldering techniques could be used. The described method is suitable for use in bonding glass, ceramics, semiconductors and/or metals, though some consideration may be given to the compatibility of the bonded materials in terms of their respective coefficients of thermal expansion between room temperature and the temperature applied to the materials during solder joint formation. In one embodiment, no heat is applied to the metals, with only pressure being relied on to form the solder joint. This technique may be referred to as cold welding. In the cold welding process the solder precursor layer is a single layer of metal, such as a noble metal. For example, a single layer of gold having a thickness in a range from about 5-10 μm may be deposited over a component surface and arranged between the two plates and pressed together to form the joint.

It is to be understood that the foregoing description is of one or more embodiments of the invention. The invention is not limited to the particular embodiment(s) disclosed herein, but rather is defined solely by the claims below. Furthermore, the statements contained in the foregoing description relate to the disclosed embodiment(s) and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A method of making an organic vapor jet printing device, comprising the steps of:
   (a) providing a nozzle plate having a fluid inlet side and a mounting plate having a fluid outlet side;

(b) depositing an adhesion layer over at least one of said inlet or outlet sides;
(c) depositing a diffusion barrier layer over at least one of said inlet or outlet sides;
(d) depositing a layer of noble metal over at least one of said inlet or outlet sides;
(e) depositing a layer of metal capable of forming a eutectic alloy with the noble metal over; and
(f) forming said eutectic alloy between said inlet and outlet sides with said inlet and outlet sides facing each other,
wherein the diffusion barrier layer and the adhesion layer are located between the eutectic alloy and at least one of said plates, a diffusion rate of at least one of the metals deposited in steps (d) and (e) with the diffusion barrier layer being lower than a diffusion rate with said at least one of said plates so that the diffusion barrier layer substantially prevents interdiffusion of the eutectic alloy with said at least one of said plates, and
wherein the adhesion layer is formed from a material different from the diffusion barrier layer, the solder joint, and said at least one of said plates.

2. The method of claim 1, wherein the nozzle plate comprises silicon.

3. The method of claim 1, wherein the diffusion barrier layer and the adhesion layer are located between the eutectic alloy and the nozzle plate, whereby the diffusion barrier layer substantially prevents interdiffusion of the eutectic alloy with the nozzle plate.

4. The method of claim 1, wherein the eutectic alloy circumscribes fluid flow ports of the nozzle plate and of the mounting plate.

5. The method of claim 1, wherein the layer of noble metal is deposited over the layer of metal capable of forming the eutectic alloy.

6. The method of claim 1, wherein the layer of noble metal and the layer of metal capable of forming the eutectic alloy are co-deposited.

7. The method of claim 1, wherein the noble metal and the metal capable of forming the eutectic alloy are deposited in respective amounts corresponding to the eutectic composition of the eutectic alloy.

8. The method of claim 1, wherein step (f) comprises the step of heating the metal layers deposited in steps (d) and (e) to a temperature above the melting point of the eutectic alloy.

* * * * *